United States Patent [19]
Fujii et al.

[11] Patent Number: 5,250,591
[45] Date of Patent: * Oct. 5, 1993

[54] CURABLE ADHESIVE COMPOSITION

[75] Inventors: Ryuichi Fujii; Takayuki Kawano, both of Tokyo, Japan

[73] Assignee: Somar Corporation, Tokyo, Japan

[*] Notice: The portion of the term of this patent subsequent to Mar. 19, 2008 has been disclaimed.

[21] Appl. No.: 680,016

[22] Filed: Jun. 19, 1991

Related U.S. Application Data

[63] Continuation of Ser. No. 313,210, Feb. 21, 1989, abandoned.

[30] Foreign Application Priority Data

Feb. 20, 1988 [JP] Japan ................................. 63-37853
Feb. 20, 1988 [JP] Japan ................................. 63-37854

[51] Int. Cl.$^5$ ............... C08L 67/06; C08L 39/04; C08J 3/28; C08F 271/02
[52] U.S. Cl. .................... 523/521; 522/117; 522/137; 522/138; 524/530; 525/261; 525/281
[58] Field of Search ............ 522/117, 137, 138; 523/521; 524/530; 525/281; 526/261

[56] References Cited

U.S. PATENT DOCUMENTS

| | | | |
|---|---|---|---|
| 4,156,035 | 5/1979 | Tsao et al. | 522/15 |
| 4,309,334 | 1/1982 | Valitsky | 523/219 |
| 4,406,826 | 9/1983 | Morgan et al. | 524/780 |
| 4,420,597 | 12/1983 | Gruber | 526/261 |
| 4,443,495 | 4/1984 | Morgan et al. | 524/780 |
| 4,450,871 | 5/1984 | Sato | 428/34.9 |
| 4,465,718 | 8/1984 | Gruber | 524/300 |
| 4,498,964 | 2/1985 | Hüsler et al. | 522/34 |
| 4,518,472 | 5/1985 | Kishida | 522/117 |
| 4,525,258 | 6/1985 | Watanabe et al. | 522/14 |
| 4,526,920 | 7/1985 | Sakashita et al. | 526/261 |
| 4,559,371 | 12/1985 | Hüsler et al. | 522/34 |
| 4,563,438 | 1/1986 | Berner et al. | 522/10 |
| 4,574,138 | 3/1986 | Moran, Jr. et al. | 524/786 |
| 4,607,068 | 8/1986 | Ansel | 526/261 |
| 4,691,045 | 9/1987 | Fukuchi et al. | 522/95 |
| 4,739,052 | 4/1988 | Hüsler et al. | 522/34 |
| 4,812,489 | 3/1989 | Watanabe et al. | 522/42 |
| 4,814,365 | 3/1989 | Takiyama | 523/521 |
| 4,855,334 | 8/1989 | Maruyama et al. | 526/261 |
| 4,902,440 | 2/1990 | Takeyama et al. | 522/96 |
| 4,992,547 | 2/1991 | Berner et al. | 522/9 |
| 5,001,168 | 3/1991 | Fujii et al. | 522/14 |

FOREIGN PATENT DOCUMENTS

| | | | |
|---|---|---|---|
| 0114117 | 7/1984 | European Pat. Off. | |
| 0195984 | 10/1986 | European Pat. Off. | |
| 53-8201 | 1/1978 | Japan | |
| 0074708 | 5/1983 | Japan | 526/261 |
| 0172568 | 9/1984 | Japan | 526/261 |
| 0231718 | 11/1985 | Japan | 526/261 |
| 0231719 | 11/1985 | Japan | 526/261 |
| 62-50310 | 3/1987 | Japan | |

OTHER PUBLICATIONS

Patent Abstracts of Japan, vol. 8, No. 232.

*Primary Examiner*—Paul R. Michl
*Assistant Examiner*—Peter Szekely
*Attorney, Agent, or Firm*—Sughrue, Mion, Zinn, Macpeak & Seas

[57] ABSTRACT

A curable adhesive composition is disclosed, comprising a polymerizable prepolymer, a reactive diluent, and a polymerization initiator, wherein said composition further comprises an inorganic filler and/or a (meth)acrylate having an isocyanurate ring.

The adhesive composition of the invention is curable by the action of heat or light and is extremely useful as an adhesive for surface mounting devices.

16 Claims, No Drawings

CURABLE ADHESIVE COMPOSITION

This is a Continuation of Application No. 07/313,210 filed Feb. 21, 1989 now abandoned.

FIELD OF THE INVENTION

This invention relates to a curable adhesive composition, and more particularly to an adhesive composition which is curable by the action of heat or light and useful as an adhesive for surface mounting devices (hereinafter referred to as "SMD").

BACKGROUND OF THE INVENTION

Mounting of SMD, such as chip resistors and chip capacitors, on printed circuit boards has been carried out by temporarily fixing the SMD to the circuit board with an adhesive and then soldering repeatedly. In the soldering step, the adhesion performance of the adhesive is reduced due to abrupt thermal shocks to cause release of the SMD. It has been, therefore, demanded to develop an adhesive whose adhesion performance is not subject to change between before and after the soldering step.

SUMMARY OF THE INVENTION

One object of this invention is to provide a curable adhesive composition suitable as an adhesive for mounting SMD on printed circuit boards.

The present invention relates to a curable adhesive composition comprising a polymerizable prepolymer, a reactive diluent, and a polymerization initiator, wherein said composition further comprises an inorganic filler and/or a (meth)acrylate having an isocyanurate ring.

The curable adhesive composition of this invention exhibits high adhesion strength at room temperature, which undergoes substantially no reduction even on repeated exposure to a soldering temperature, and hence effectively prevents release of SMD.

DETAILED DESCRIPTION OF THE INVENTION

Examples of the polymerizable prepolymer which can be used in this invention include unsaturated polyesters, epoxy (meth)acrylates, urethane (meth)acrylates, oligoester (meth)acrylates, etc.

The above-described unsaturated polyesters are polyesters having a molecular weight of from 1,000 to 10,000 and containing therein ethylenically unsaturated bonds and are commercially available under the trade names of, for example, Upica ® 8554 (made by Nippon Upica Co., Ltd.) and New Track ® 410 S (made by Kao Corporation).

The above-described epoxy (meth)acrylates are products obtained by esterifying epoxy resins having bisphenol-A, phenol or cresol novolak as a skeleton with (meth)acrylic acid and are commercially available under the trade names of, for example, Ripoxy ®SP-1509 and SP-4010 (made by Showa Highpolymer Co., Ltd.).

The above-described urethane (meth)acrylates are generally obtained by reacting a diol such as aliphatic diols (e.g., ethylene glycol, etc.), ether diols having two hydroxyl groups at the ether chain terminal ends, and ester diols having two hydroxyl groups at the ester chain terminal ends with a stoichiometric excess of a diisocyanate such as toluene diisocyanate, isophorone diisocyanate, etc. to form a urethane compound having isocyanate groups at the terminal ends which is then further reacted with a hydroxyalkyl (meth)acrylate. Commercial products are available under the trade names of, for example, Uvithane ® 893 (made by Thiochol Chemical Corp.) and U-6HA (made by Shin Nakamura Kagaku Kogyo Co., Ltd.).

The above-described oligoester (meth)acrylates are polyfunctional (meth)acrylates having, as a skeleton, an ester compound obtained from aromatic carboxylic acids and are commercially available under the trade names of, for example, Aronix ®M-8060 and M-7100 (made by Toagosei Chemical Industry Co., Ltd.).

The reactive diluent which is used in this invention is added for the purpose of adjusting the viscosity of the curable composition or characteristics of cured products, and examples thereof include polyfunctional (meth)acrylates, monofunctional (meth)acrylates, etc.

Examples of the above-described polyfunctional (meth)acrylates include trimethylolpropane tri(meth)acrylate, pentaerythritol tetra(meth)acrylate, dipentaerythritol hexa(meth)acrylate, tris[meth](acryloxyethyl) isocyanurate, 1,6-hexanediol di(meth)acrylate, triethylene glycol di(meth)acrylate, neopentyl glycol di(meth)acrylate, polyethylene glycol di(meth)acrylate, neopentyl glycol hydroxypivalate di(meth)acrylate, (meth)acrylated compounds of bisphenol A having ethylene oxide added thereto, and diglycidyl ester di(meth)acrylates of dibasic fatty acids containing 4 or more carbon atoms. Commercial products are available under the trade names of, for example, Viscoat ® #3700 and #700 (made by Osaka Yuki Co., Ltd.), MANDA ® (made by Nippon Kayaku Co., Ltd.), Aronix ®M6100, M6300 and TD-1600A (made by Dainippon Ink and Chemicals, Inc.), and ULB-20GEA (Okamura Seiyu Co., Ltd.).

Examples of the above-described monofunctional (meth)acrylates include hydroxyethyl (meth)acrylate tetrahydrofurfuryl (meth)acrylate, phenoxyethyl (meth)acrylate, dicyclopentenyl (meth)acrylate, etc.

The weight proportion of the polymerizable prepolymer to the reactive diluent can be arbitrarily varied but is usually in the range of from 10:90 to 80:20 and preferably in the range of from 20:80 to 70:30.

The polymerization initiator as referred to herein includes both a photopolymerization initiator and/or a heat polymerization initiator.

Examples of the photopolymerization initiator include benzoin ether-based compounds, benzophenonebased compounds, acetophenone-based compounds, thio-xanthone-based compounds, etc. Specific examples are benzoin isopropyl ether, benzoin isobutyl ether, benzophenone, 2,2-dimethoxy-2-phenylacetophenone-1-hydroxyisobutylphenohe, phenyl ketone, p-isopropyl-α-hydroxyisobutylphenone, α-hydroxy isobutyl ketone, 1,1-dichloroacetophenone, 2-chlorothioxanthone, 2-methylthioxanthone, methylbenzoyl formate, etc. These compounds can be used alone or in admixture.

As the heat polymerization initiator, usual ordinary organic peroxides can be used. Specific examples include ketone peroxides such as methyl ethyl ketone peroxide, cyclohexanone peroxide, etc.; diacyl peroxides such as acetyl peroxide, benzoyl peroxide, etc.; hydroperoxides such as t-butyl hydroperoxide, cumene hydroperoxide etc.; dialkyl peroxides such as dit-butyl peroxyde, dicumyl peroxide, etc.; alkyl peresters such as t-butyl peracetate, t-butyl perbenzoate, etc.; peroxycarbonates such as diisopropyl peroxydicarbonate, bis(4-t-butylcyclohexyl)peroxydicarbonate, etc.; and peroxyketals such as 1,1-bis(t-butylperoxy)3,3,5-trimethylcyclohexane, 1,1-bis(t-butylperoxy)cyclohexane, etc. These compounds can be used alone or in admixture.

The amount of the initiator is usually in the range of from 0.2 to 20 parts by weight based on 100 parts by weight of the sum of the polymerizable prepolymer and the reactive diluent.

The inorganic filler which can be used in the present invention preferably comprises a combination of a spherical inorganic filler and a flaky inorganic filler. The spherical inorganic filler includes spherical fused silica, glass, bead, alumina powder, silica balloon, and synthetic calcium silicate. Implicit in the flaky inorganic fillers are talc, calcium silicate, zeolite, kaolin, calcined clay, bentonite, sericite, and basic magnesium carbonate. Commercially available products of inorganic fillers include FB-44 (spherical fused silica produced by Denki Kagaku Kogyo K.K.), EGB-210 (glass bead produced by Toshiba-Ballotini Co., Ltd.), LMR-100 (flaky talc produced by Fuji Talc Co., Ltd.), and Iceberg ® (flaky clay produced by Bergen Pigment Co., Ltd.).

In particular, a combination of spherical fused silica or glass bead as a spherical inorganic filler and talc as a flaky inorganic filler in a specific mixing ratio is effective.

The amount of the spherical inorganic filler to be used ranges from 10 to 50 parts by weight per 100 parts by weight of the total amount of the polymerizable prepolymer and the reactive diluent. The amount of the flaky inorganic filler to be used ranges from 50 to 150 parts by weight on the same basis. If the spherical inorganic filler and flaky inorganic filler are used in admixture, the total amount thereof ranges from 60 to 200 parts by weight per 100 parts by weight of the total amount of the polymerizable prepolymer and the reactive diluent, with the mixing ratio of the spherical inorganic filler to the flaky inorganic filler being arbitrarily variable within the above-recited ranges of the respective components. If the amount of either one or both of the spherical inorganic filler and flaky inorganic filler is less than the respective lower limit, the adhesion strength after soldering is considerably reduced. If it exceeds the respective upper limit, the initial adhesion strength before soldering is reduced. The amounts of these inorganic fillers can be appropriately controlled within the above ranges so as to obtain a viscosity suitable for end use. The (meth)acrylate having an isocyanurate ring which can be used in the present invention is represented by formula (I):

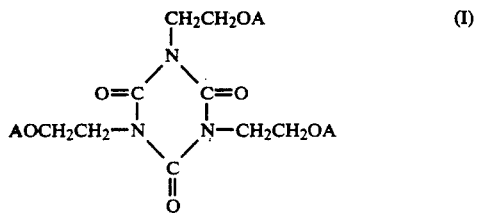

wherein A's, which may be the same or different, each represents a hydrogen atom,

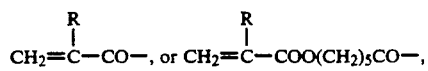

wherein R represents a hydrogen atom or a methyl group.

The compounds represented by formula (I) are known per se and can be prepared by reacting a reactive derivative of isocyanuric acid and a reactive derivative of (meth)acrylic acid.

Specific examples of the compounds of formula (I) include FA-731A (a compound wherein all of A's are

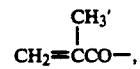

produced by Hitachi Chemical Co., Ltd.), Aronix ® M-215 (a compound wherein one of A's is a hydrogen atom, and others are $CH_2=CHCO-$, produced by Toa Gosei Chemical Industry Co., Ltd.), and Aronix ® M-325 (a compound wherein one of A's is $CH_2=CHCOO(CH_2)_5CO-$, and others are $CH_2=CHCO-$, produced by Toa Gosei Chemical Industry Co., Ltd.).

The (meth)acrylate having an isocyanurate ring is used in an amount usually ranging from 1 to 40 parts by weight, preferably from 5 to 30 parts by weight, per 100 parts by weight of the total amount of the polymerizable prepolymer and the reactive diluent. If the amount of this component is less than 1 part, sufficient adhesion strength at room temperature or high temperatures cannot be assured so that the SMD tends to fall down from the printed circuit board during soldering. If it exceeds 40 parts, curing reaction would drastically proceed to cause large strain during curing so that the cured adhesive tends to have brittleness and low adhesion.

The curable composition of this invention can, if desired, contain additives such as chelating agents, heat polymerization inhibitors, coloring agents, thixotropic agents, and curing accelerator, unless they hinder the object of this invention.

Specific examples of the chelating agent include iminodiacetic acid, N-methyliminodiacetic acid, nitrilotriacetic acid, ethylenediamine-N,N'-diacetic acid, ethylenediamine-N,N,N',N'-tetraacetic acid, N-hydroxyethylethylenediamine-N,N',N'-triacetic acid, and sodium salts thereof as well as N,N,N',N'-tetrakis-(2-hydroxypropyl)ethylenediamine, etc.

Examples of the heat polymerization inhibitor include hydroquinone, p-methoxyphenol, benzoquinone, phenothiazine, cupferron, etc.

Examples of the coloring agent include azo-based, phthalocyanine-based, isoindolinone-based and anthraquinone-based coloring agents, carbon black, etc.

Examples of the thixotropic agent include bentonite, ultrafine silica, etc.

Examples of the curing accelerator which is used in combination with cumene hydroperoxide include metal salts of long-chain organic acids, such as cobalt naphthenate, cobalt octenoate, etc.; amines such as dimethylaniline, N-phenylmorpholine, etc.; quaternary ammonium salts such as triethylbenzylammonium chloride, etc.; and aminophenols such as 2,4,6-tris(dimethylaminomethyl)phenol, etc.

The curable composition of this invention is prepared in the following manner. That is, the polymerizable prepolymer, reactive diluent, and optionally (meth)acrylate containing an isocyanurate ring as well as photopolymerization initiator, heat polymerization inhibitor, chelating agent, etc. are uniformly dissolved in advance, and thereafter, the thixotropic agent, coloring agent, etc. and optionally inorganic filler are mixed and dispersed. The heat polymerization initiator is then added and uniformly mixed. The mixing is usually carried out at not higher than 60° C. using a rotary agitator or a three-roll mill.

The present invention is now illustrated in greater detail by way of the following Examples and Comparative Examples, but it should be understood that the present invention is not deemed to be limited thereto. In these examples, all the parts are by weight unless otherwise specified.

Adhesion properties of the curable adhesive compositions obtained in these examples were measured according to the following methods.

1) Initial Adhesion Strength

The curable composition was applied in an amount of from about 0.3 to 0.5 mg onto a printed circuit board and, after a multilayer ceramic chip capacitor (3.2 mm × 1.6 mm) was mounted in the central part thereof, the assembly was irradiated with an ultraviolet light for about 20 seconds at a distance of 20 cm from a high-pressure mercury vapor lamp having a power input of 80 W/cm. Immediately thereafter, the assembly was heated for 10 minutes in an atmosphere at 120° C. Then, the shear adhesion strength (kg) per chip was measured at room temperature.

2) Adhesion Strength at 100° C.

The sample as prepared in 1) above was placed on an equipment by which the temperature of the printed circuit board was maintained at 100±2° C., and the shear adhesion strength (kg) per chip at 100° C. was measured.

3) Adhesion Strength Retention after Dipping in Soldering Bath

The sample as prepared in 1) above was dipped in a soldering bath kept at 260±2° C. for 10 seconds and cooled to room temperature. After this soldering operation was repeatedly conducted 6 times, the shear adhesion strength (kg) was measured. An adhesion strength retension after soldering (%) was obtained by dividing the shear adhesion strength after soldering by the initial adhesion strength as measured in 1) and multiplying the quotient by 100.

EXAMPLES 1 TO 3 AND COMPARATIVE EXAMPLES 1 TO 4

| | |
|---|---|
| Unsaturated polyester (Upica ® 8554 produced by Nippon Upica Co., Ltd.; molecular weight: ca. 2,500) | 100 parts |
| Bifunctional acrylate (ULB-20 GEA produced by Okamura Seiyu Co., Ltd.) | 70 parts |
| Tetrahydrofurfuryl methacrylate | 100 parts |

The above components were uniformly dissolved by thoroughly stirring. To 100 parts of the mixture were added inorganic fillers and other components as shown in Table 1 below, followed by stirring to prepare an adhesive composition.

Each of the adhesive compositions was evaluated according to the above-described methods, and the results obtained are shown in Table 1.

As is apparent from Table 1, the compositions according to the present invention prove superior to the comparative compositions.

TABLE 1

| | Example 1 | Example 2 | Example 3 | Comparative Example 1 | Comparative Example 2 | Comparative Example 3 | Comparative Example 4 |
|---|---|---|---|---|---|---|---|
| Components (part): | | | | | | | |
| Mixture | 100 | 100 | 100 | 100 | 100 | 100 | 100 |
| Spherical silica*1 | 20 | — | 10 | — | 70 | 10 | — |
| Spherical glass*2 | — | 50 | — | — | — | — | — |
| Flaky talc*3 | 90 | — | 120 | 90 | 50 | — | 90 |
| Flaky clay*4 | — | 50 | — | — | — | — | — |
| Random-shaped Fused Silica*5 | — | — | — | — | — | 120 | 20 |
| Photopolymerization initiator*6 | 3 | 3 | 3 | 3 | 3 | 3 | 3 |
| Heat polymerization initiator*7 | 3 | 3 | 3 | 3 | 3 | 3 | 3 |
| Heat polymerization inhibitor*8 | 0.1 | 0.1 | 0.1 | 0.1 | 0.1 | 0.1 | 0.1 |
| Chelating agent*9 | 0.1 | 0.1 | 0.1 | 0.1 | 0.1 | 0.1 | 0.1 |
| Adhesion Properties: | | | | | | | |
| Initial adhesion strength (kg) | 5.0 | 3.6 | 4.0 | 3.0 | 2.0 | 1.5 | 3.0 |
| Adhesion strength after soldering (kg) | 4.9 | 3.5 | 3.8 | 1.8 | 1.9 | 1.1 | 1.8 |
| Adhesion strength retention (%) | 98 | 98 | 95 | 60 | 95 | 73 | 60 |

Note:
*1FB-44 produced by Denki Kagaku Kogyo K.K.; avg. particle diameter: ca. 10.0 μm
*2EGB-210 produced by Toshiba-Ballotini Co., Ltd.; avg. particle diameter: ca 17.0 μm
*3LMR-100 produced by Fuji Talc Co., Ltd.; avg. particle diameter: ca. 3.0 μm
*4Iceberg ® produced by Bergen Pigment Co., Ltd., avg. particle diameter: ca. 1.4 μm
*5Fuselex ® RD-8 produced by Tatsumori Ltd.; avg. particle diameter: ca. 15.0 μm
*6Irgacure ® 651 produced by Chiba-Geigy AG
*7Trigonox ® 22-B75 produced by Kayaku Noury Corporation
*8p-Methoxyphenol
*9Tetrasodium N,N,N',N'-tetraethylenediaminetetraacetate

EXAMPLES 4 TO 9 AND COMPARATIVE EXAMPLES 5 TO 6

| | |
|---|---|
| Polymerizable prepolymer (Upica ® 8554) | 35 parts |
| Bifunctional acrylate (ULB-20 GEA) | 25 parts |
| Reactive diluent (phenoxyethyl acrylate) | 40 parts |
| Isocyanurate ring-containing (meth)acrylate | see Table 2 |
| Photopolymerization initiator (Darocur ® 1173 produced by Merk Co., Ltd.) | 3 parts |
| Heat polymerization initiator (Perhexa ® 3M produced by Nippon Oils & Fats Co., Ltd.) | 3 parts |
| Heat polymerization inhibitor (cupferron) | see Table 2 |
| Chelating agent (tetrasodium ethylene-diaminetetraacetate) | 0.05 part |
| Flaky talc (High Toron ® A produced by Takehara Kagaku Co., Ltd.; avg. particle diameter: 3.0 μm) | 100 parts |

The above components were mixed by stirring to prepare a curable adhesive composition, and each of the resulting compositions was evaluated as described above. The results obtained are shown in Table 2.

It can be seen from Table 2 that the compositions according to the present invention are superior to the comparative ones.

TABLE 2

| | Example 4 | Example 5 | Example 6 | Example 7 | Example 8 | Example 9 | Comparative Example 5 | Comparative Example 6 |
|---|---|---|---|---|---|---|---|---|
| Isocyanurate ring-containing (meth)acrylate (part): | | | | | | | | |
| FA-731A*[10] | 5 | 30 | — | — | — | 30 | — | 50 |
| M-325*[11] | — | — | 10 | — | 10 | — | — | — |
| M-215*[12] | — | — | — | 10 | — | — | — | — |
| Inorganic filler (part): | | | | | | | | |
| High Toron ® A*[13] | 100 | 100 | 100 | 100 | 90 | 50 | 100 | 100 |
| FB-44*[14] | — | — | — | — | 10 | 50 | — | — |
| Adhesion performance: | | | | | | | | |
| Initial adhesion strength (kg) | 5.0 | 5.8 | 5.0 | 5.0 | 5.8 | 4.8 | 3.0 | 3.0 |
| Adhesion strength at 100° C. (kg) | 1.5 | 2.0 | 1.8 | 1.8 | 2.1 | 1.8 | 0.5 | 1.0 |
| Adhesion strength retention (%) | 90 | 92 | 96 | 94 | 97 | 98 | 60 | 65 |

Note:
*[10]FA-731A, a trade name of tris(acryloxyethyl) isocyanurate produced by Hitachi Chemical Co., Ltd.
*[11]Aronix ® M-325, a trade name of caprolactone-modified tris(acryloxyethyl) isocyanurate produced by Toa Gosei Chemical Industry Co., Ltd.
*[12]Aronix ® M-215, a trade name of bis(acryloxyethyl)hydroxyethyl isocyanurate produced by Toa Gosei Chemical Industry Co., Ltd.
*[13]High Toron ® A, a trade name of flaky talc produced by Takehara Kagaku Co., Ltd.
*[14]FB-44, a trade name of spherical fused silica produced by Denki Kagaku Kogyo K.K.

While the invention has been described in detail and with reference to specific embodiments thereof, it will be apparent to one skilled in the art that various changes and modifications can be made therein without departing from the spirit and scope thereof.

What is claimed is:

1. A curable adhesive composition comprising a polymerizable prepolymer selected from the group consisting of unsaturated polyesters, epoxy (meth)acrylates, urethane (meth)acrylates and oligoester (meth)acrylates, a reactive diluent which differs from said polymerizable prepolymer, which reactive diluent is selected from the group consisting of a mono- or polyfunctional (meth)acrylates, said reactive diluent being added to adjust the viscosity of the curable adhesive composition, and a polymerization initiator for the polymerization for the polymerization of ethylenically unsaturated group, wherein said composition further comprises an inorganic filler comprising a combination of a spherical inorganic filler and a flaky inorganic filler, with the contents of said spherical inorganic filler and flaky inorganic filler being from 10 to 50 parts by weight and from 50 to 150 parts by weight, respectively, based on 100 parts by weight of the total amount of said polymerizable prepolymer and reactive diluent.

2. A curable adhesive composition as in claim 1, wherein said spherical inorganic filler is spherical fused silica or glass bead, and said flaky inorganic filler is talc.

3. A curable adhesive composition as claimed in claim 1 wherein said oligoester (meth)acrylates have, as a skeleton, an ester compound obtained from aromatic carboxylic acids, and said polyfunctional (meth)acrylate is selected form the group consisting of trimethylpropane tri(meth)acrylate, pentaerythritol tetra(meth)acrylate, dipentaerythritol hexa(meth)acrylate, tris(-meth)(acrylate) isocyanurate, 1,6-hexanediol di(meth)acrylate, triethylene glycol di(meth)acrylate, neopentyl glycol di(meth)acrylate, polyethyelen glycol di(meth)acrylate, neopentyl glycol hydroxypivalate di(meth)acrylate, (meth)acrylated compounds of bisphenol A having ethylene oxide added thereto, and diglycidyl ester di(meth)acrylates of dibasic fatty acids containing 4 or more carbon atoms.

4. The curable adhesive composition of claim 3 wherein said polymerizable prepolymer is selected from the group consisting of unsaturated polyesters, epoxy (meth)acrylates and urethane (meth)acrylates.

5. A curable adhesive composition as claimed in claim 1, wherein the weight proportion of the polymerizable prepolymer to the reactive diluent is in the range of from 10:90 to 80:20 and the polymerization initiator is used in an amount of from 0.2 to 20 parts by weight based on 100 parts by weight of the sum of the polymerizable prepolymer and the reactive diluent.

6. A curable adhesive composition as claimed in claim 4, wherein the weight proportion of the polymerizable prepolymer to the reactive diluent is in the range of from 10:90 to 80:20 and the polymerization initiator is used in an amount of from 0.2 to 20 parts by weight based on 100 parts by weight of the sum of the polymerizable prepolymer and the reactive diluent.

7. A curable adhesive composition comrpising a polymerizable prepolymer selected from the group consisting of unsaturated polyesters, epoxy (meth)acrylates, urethane (meth)acrylates and oligoester (meth)acrylates, a reactive diluent which differs from said polymerizable prepolymer and a (meth)acrylate having an isocyanurate ring, which reactive diluent is selected from the group consisting of a mono- or polyfunctional (meth)acrylate, said reactive diluent being added to adjust the viscosity of the curable adhesive composition, and a polymerization initiator for the polymerization of ethylenically unsaturated groups, wherein said composition further comprises a (meth)acrylate having an isocyanurate ring in an amount of from 1 to 40 parts by weight based on 100 parts by weight of the total amount of said polymerizable prepolymer and reactive diluent, said (meth)acrylate having an isocyanurate ring being added to improve the adhesion strength at room temperature or high temperature of the curable adhesive composition, and wherein said composition further comprises an inorganic filler comprising a combination of a spherical inorganic filler and a flaky inorganic filler, with the contents of said spherical inorganic filler and flaky inorganic filler being from 10 to 50 parts by weight and from 50 to 150 parts by weight, respectively, based on 100 parts by weight of the total amount of said polymerizable prepolymer and reactive diluent.

8. A curable adhesive composition as in claim 7, wherein said (meth) acrylate containing an isocyanurate ring is a compound represented by formula (I):

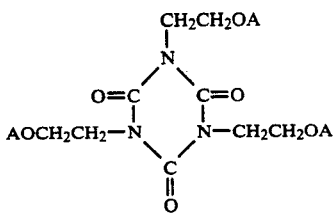
(I)

wherein A's, which may be the same or different are each a hydrogen atom,

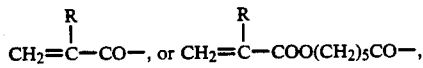

wherein R is a hydrogen atom or a methyl group.

9. A curable adhesive composition as in claim 8, wherein all of A's are

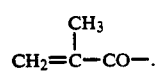

10. A curable adhesive composition as in claim 8, wherein one of the A's is a hydrogen atom and other two of A's are $CH_2=CHCO-$.

11. A curable adhesive composition as in claim 8, wherein one of A's is $CH_2CHDOO(CH_2)_5CO-$ and other two of A's are $CH_2=CHCO-$.

12. A curable adhesive composition as in claim 7, wherein said (meth)acrylate having an isocyanurate ring is used in an amount of from 5 to 30 parts by weight based on 100 parts by weight of the total amount of said polymerizable prepolymer and reactive diluent.

13. A curable adhesive composition as claimed in claim 7 wherein said oligoester (meth)acrylates have, as a skeleton, an ester compound obtained from aromatic carboxylic acids, said polyfunctional (meth)acrylate is selected from the group consisting of trimethylpropane tri(meth)acrylate, pentaerythritol tetra(meth)acrylate, dipentaerythritol hexa(meth)acrylate, tris(meth)acrylate, isocyanurate, 1,6-hexanedioltriethylene glycol di(meth)acrylate, neopentyl di(meth)acrylate, glycol di(meth)acrylate, polyethyelen glycol di(meth)acrylate, neopentyl glycol hydroxypivalate di(meth)acrylate, (meth)acrylated compounds of bisphenol A having ethylene oxide added thereto, or diglycidyl ester di(meth)acrylates of dibasic fatty acids containing 4 or more carbon atoms, and said (meth)acrylate having an isocyanurate ring is a compound represented by formula (I):

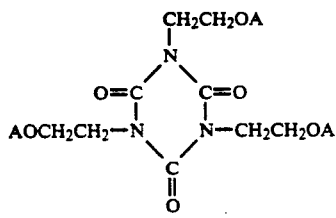

wherein A's, which may be the same or different are each a hydrogen atom,

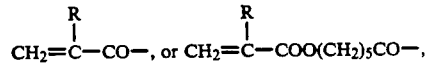

wherein R is a hydrogen atom or a methyl group.

14. The curable adhesive composition of claim 13 wherein said polymerizable prepolymer is selected from the group consisting of unsaturated polyesters, epoxy (meth)acrylates and urethane (meth)acrylates.

15. A curable adhesive composition as claimed in claim 7, wherein the weight proportion of the polymerizable prepolymer to the reactive diluent is in the range of from 10:90 to 80:20 and the polymerization initiator is used in an amount of from 0.2 to 20 parts by weight based on 100 parts by weight of the sum of the polymerizable prepolymer and the reactive diluent.

16. A curable adhesive composition as claimed in claim 14, wherein the weight proportion of the polymerizable prepolymer to the reactive diluent is in the range of from 10:90 to 80:20 and the polymerization initiator is used in an amount of from 0.2 to 20 parts by weight based on 100 parts by weight of the sum of the polymerizable prepolymer and the reactive diluent.

* * * * *